(12) United States Patent
Kraft et al.

(10) Patent No.: US 6,254,685 B1
(45) Date of Patent: Jul. 3, 2001

(54) CHEMICAL VAPOR DEPOSITION TRAP WITH TAPERED INLET

(75) Inventors: Donald Kraft; Emmett M. Howard, Jr.; R. Scott Hibben, all of Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/181,936

(22) Filed: Jan. 18, 1994

(51) Int. Cl.$^7$ .................................................. C23C 16/01
(52) U.S. Cl. .............................................................. 118/715
(58) Field of Search .......................... 118/715; 55/264, 55/266, 413

(56) References Cited

U.S. PATENT DOCUMENTS

| | | | |
|---|---|---|---|
| 4,640,221 | * | 2/1987 | Barbee et al. ........................ 118/689 |
| 4,725,204 | * | 2/1988 | Powell ................................ 118/715 |
| 4,950,156 | * | 8/1990 | Philipossian ........................ 118/715 |
| 4,992,044 | * | 2/1991 | Philipossian ........................ 432/253 |
| 5,346,555 | * | 9/1994 | Nunotani et al. .................... 118/724 |

FOREIGN PATENT DOCUMENTS

0312833 * 12/1989 (JP) ...................................... 118/715

* cited by examiner

Primary Examiner—Felisa Hiteshew
(74) Attorney, Agent, or Firm—Robert F. Hightower

(57) ABSTRACT

A trap filter chamber (16) removes chemical by-products created during the manufacturing process of semiconductor wafers in a low pressure chemical vapor deposition reactor (12). A vapor containing the process by-products is discharged from the reactor to the trap chamber (16) by way of connecting pipe (14). The vapors are drawn through the trap chamber by a vacuum pump (20). The connecting pipe at the inlet of the trap chamber has a tapered diameter section (28, 30) such that its outlet is larger in diameter than its inlet. The tapered section gradually and linearly reduces the pressure from the reactor to the inlet of the trap filter chamber thereby substantially reducing particulate by-product build-up at the inlet to the trap filter caused by temperature-pressure related precipitation.

14 Claims, 1 Drawing Sheet

CHEMICAL VAPOR DEPOSITION TRAP WITH TAPERED INLET

BACKGROUND OF THE INVENTION

The present invention relates in general to semiconductor wafer processing and, more particularly, to trapping particulate by-products from a chemical vapor deposition process during manufacture of semiconductor wafers.

It is well known in the art that semiconductor wafer processing for integrated circuits includes processes that require chemical vapor depositions such as nitride, polysilicon, and low temperature oxide depositions. Semiconductor wafers are placed in a quartz crystal tube that is housed in a high temperature reactor. The reactor is typically a low pressure chemical vapor deposition (LPCVD) reactor. A continuous flow gaseous vapor that has been heated to a high temperature is drawn through the LPCVD reactor to cause the desired chemical reaction to take place with the semiconductor wafers. The vapor exits the reactor chamber through a pipe that connects to a trap filter. A vacuum pump draws the vapor from the reactor chamber through the trap filter to capture particulate by-products from the heated vapor. The remaining vapor is passed on to a scrubber to further neutralize the toxic effects of the exhausted gas.

The vapor particulates produced by the LPCVD process have a tendency to accumulate in the pipe at the inlet of the trap filter chamber because of the sudden pressure change between the pipe and trap filter chamber. It is desired that the particulate formation occur in the trap filter chamber. The particulates build up in the pipe and reduce its effective diameter. As the diameter of the pipe decreases, the pressure within the pipe increases which in turn causes an imbalance in the delicate pressure-vacuum in the LPCVD reactor and results in an unpredictable wafer deposition processing. Moreover, the particulates accumulating in the pipe may dislodge and migrate to the vacuum pump causing damage to the pump.

To alleviate the particulate build-up, costly maintenance cleaning schedule procedures have been implemented by semiconductor wafer manufacturers resulting in undesirable down-time.

Hence, a need exists for a chemical vapor deposition trap that reduces particulate by-product build-up at its inlet.

DETAILED DESCRIPTION OF THE PREFERRED EMBODIMENT

Figure 1:
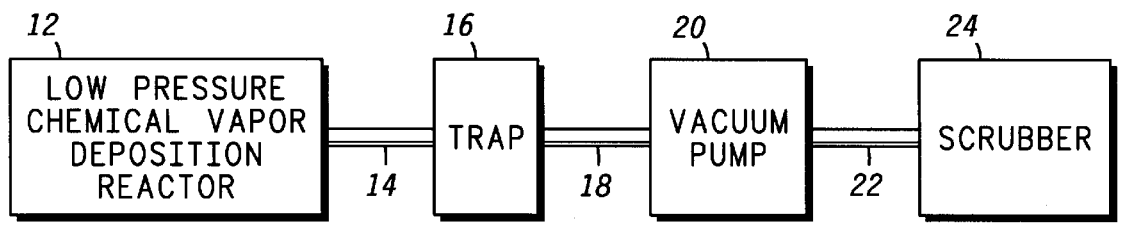
FIG. 1 is a block diagram illustrating an LPCVD reactor system.

Referring to FIG. 1, a low pressure chemical vapor deposition reactor (LPCVD) 12 has an exhaust outlet coupled through pipe 14 to an inlet of trap filter chamber 16 for transporting gaseous vapors. The outlet of trap filter chamber 16 is coupled through pipe 18 to an inlet of vacuum pump 20. Pipe 22 interconnects the outlet of vacuum pump 20 to an inlet of scrubber 24.

LPCVD reactor 12 produces several chemical reactions with semiconductor wafers (not shown) placed within the reactor. For nitride deposition upon the semiconductor wafers, the reaction is defined by the formula $3(SiH_2Cl_2)+8(NH_3)=(Si_3N_4)+4NH_4Cl+6(H_2)+2(HCL)$. For polysilicon, the reaction is defined as $SiH_4=Si+2(H_2)$, and for low temperature oxide the reaction is defined as $SiH_4+O_2=SiO_2+2(H_2)$. Any additional reactants in LPCVD reactor 12 produces a gaseous by-product from reaction of the internal vapor. It is desirable to remove the gaseous by-products from the vapor in an environmentally safe manner.

Accordingly, the heated vapor from LPCVD reactor 12 including the gaseous by-products are drawn through pipe 14 into trap chamber 16 by vacuum pump 20. These vapor gases are $H_2$ and HCL associated with nitride processing, or $H_2$ associated with polysilicon processing, or $H_2$ associated with low temperature oxide processing. Solid particulates are suppose to precipitate in trap chamber 16 due to the pressure and corresponding temperature reduction from the expansion of gases passing from pipe 14 into trap chamber 16. The particulates collecting in trap chamber 16 are nitride ($Si_3N_4$ and $4NH_4Cl$), polysilicon (Si), and low temperature oxide ($SiO_2$), for the aforementioned respective processes. The particulates adhere to stainless steel wool within the inner cavity of trap chamber 16. Trap chamber 16 also serves to prevent any oil particles from vacuum pump 20 from being drawn back into LPCVD reactor 12 and contaminating the process. Following trap chamber 16, any gaseous by-products remaining in the system are drawn through pipe 18 by vacuum pump 20. The gases are exhausted by vacuum pump 20 through pipe 22 to scrubber 24, where the gases are effectively neutralized. Thus, the combination of trap chamber 16 and scrubber 24 effectively remove the undesirable by-products from the vapor discharge of LPCVD reactor 12.

Figure 2:
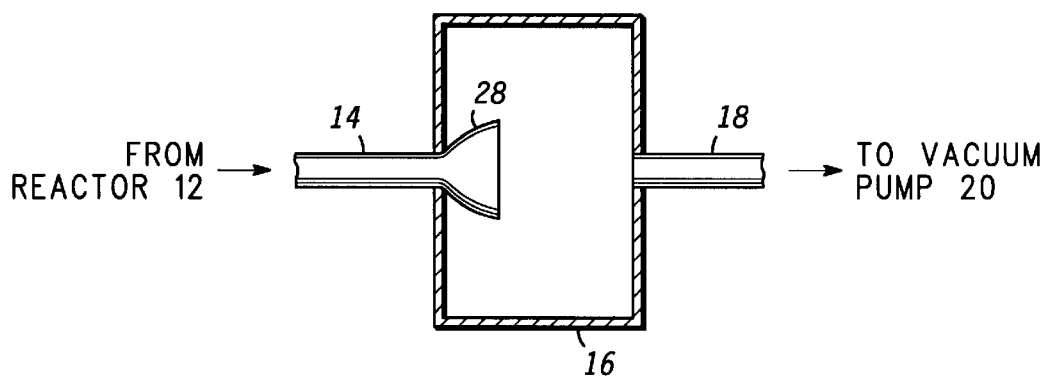
FIG. 2 illustrates a first embodiment of the trap chamber of FIG. 1.

Turning to FIG. 2, pipe 14 is shown attached to an inlet of pipe section 28 at the inlet of trap chamber 16. Pipe 14, pipe section 28, pipe 18, and trap filter chamber 16 are fabricated from SS 316 stainless steel. Pipe 14 is welded to pipe section 28 at the inlet in trap chamber 16 with an arc welder having an argon purge. The same method is used to weld pipe 18 to the outlet of trap chamber 16. The assembly of pipe 14 and pipe section 28 may be bolted to trap chamber 16 for easy disassembly and cleaning. Alternately, the assembly of pipe 14 and pipe section 28 may be welded to trap chamber 16. In the latter case, trap chamber 16 must have a removable cover for cleaning and replacing the stainless steel wool inside, or the entire assembly of pipe 14, pipe section 28 and trap chamber 16 could be disposable.

A key feature of the present invention in the gradual tapering of pipe section 28 from inlet to outlet such that the gas exiting pipe 14 undergo a gradual pressure gradient before passing into trap chamber 16. The diameter of pipes 14 and 18 are typically equal to the outlet diameter of LPCVD reactor 12. In the present embodiment, pipes 14 and 18 are 1.5 inches in diameter. In another embodiments, pipes 14 and 18 may range from 1.0 to 3.0 inches in diameter, although many other sizes are within the scope of the present invention. The inlet diameter of pipe section 28 is the same diameter as pipe 14, or about 1.5 inches. The outlet diameter of pipe section 28 is typically 33% or more larger than its inlet diameter. The outlet diameter of pipe section 28 ranges from say 2.0 inches to 5.0 inches depending on the process. In the present embodiment, the outlet diameter of pipe section 28 has a diameter of 2.0 inches for nitride and low temperature oxide processes. The outlet diameter of pipe section 28 for the polysilicon process is 3.0 inches. The outlet of pipe section 28 resides within the cavity of trap chamber 16 which reduces precipitation of vapor within pipe section 28 as its outer surface is not exposed to ambient temperatures.

The walls of pipe section 28 are tapered in a smooth fashion from inlet to outlet. Sharp edges should be avoided at the juncture of pipe 14, pipe section 28, and the inlet of trap chamber 16. Sharp edges can cause undesirable turbulent gas flow that reduces the effective diameter of pipe 14 by a Venturi effect. The sudden pressure changes associated with sharp edges in the pipe lead to precipitation of solids and buildup in the pipes. Sharp edges also create undesired nucleation sites for deposition.

The tapering of pipe section 28 may have a variety of shapes including cone-shape and bell-shape. The important feature is that the internal surface is relatively smooth and that the outlet diameter is larger than the inlet diameter in order to provide a gradual pressure reduction gradient between pipe 14 and the inlet of trap chamber 16. The pressure change across the tapered portion of pipe section 28 is approximately linear. As the heated vapor passes through the tapered diameter of pipe section 28 it expands causing a gradual pressure and temperature drop. The gradual temperature change substantially reduces precipitation of solid particulates in pipe 14 and pipe section 28. The relative diameters of inlet and outlet of section 28 controls the pressure gradient. The gradual pressure gradient reduces particulate formation within pipe 14 and pipe section 28 thereby substantially reducing particulate buildup within these pipes.

Gas pressures at the exhaust outlet of LPCVD reactor 12 and within trap chamber 16 vary from system to system and process to process. In all cases the pressure at the outlet of pipe section 28 is lower than that at the inlet of pipe section 28 because of the Venturi effect. For example with nitride processing, the pressure is approximately 700 millitorr exiting reactor 12 at temperatures between say 770 and 810° C. The vapor pressure at the outlet of pipe section 28 is approximately 500 millitorr. For nitride processes, pipe 14 is sometimes heated. With polysilicon processing pressure is approximately 325 millitorr exiting reactor 12 at temperatures between 400 and 500° C., the corresponding pressure at the outlet of pipe section 28 is approximately 225 millitorr. Low temperature oxide processing has a pressure of approximately 350 millitorr exiting reactor 12 at temperatures between 400 and 500° C. The outlet pressure of pipe section 28 is approximately 290 millitorr.

Thus, instead of forming in pipe 14, the particulates form within trap chamber 16 as desired where they are trapped in the stainless steel wool. The stainless steel wool is periodically cleaned or replaced. With reduced particulate build-up in pipe 14, the trap assembly need be cleaned less frequently say during the normal annual maintenance of LPCVD reactor 12.

Figure 3:
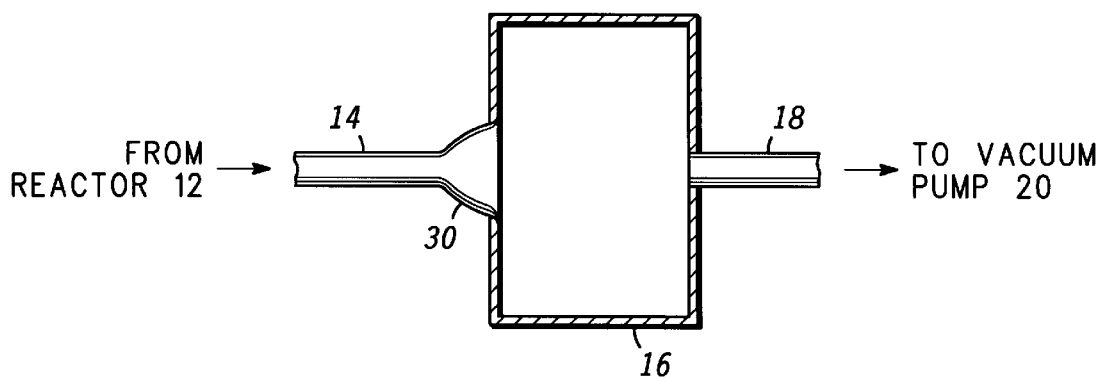
FIG. 3 illustrates an alternate embodiment of the trap chamber of FIG. 1.

Referring to FIG. 3, pipe 14 is shown attached to an inlet of pipe section 30. The outlet of pipe section 30 is attached to the inlet of trap chamber 16. Pipe section 30 is fabricated from SS 316 stainless steel. Pipe 14 is welded to an inlet of pipe section 30 with an arc welder with an argon purge. The same method is used to weld pipe 18 to the outlet of trap chamber 16. The assembly of pipe 14 and pipe section 30 may be bolted to trap chamber 16 for easy disassembly and cleaning. Alternately, the assembly of pipe 14 and pipe section 30 may be welded to trap chamber 16. In the latter case, trap chamber 16 must have a removable cover for cleaning and replacing the stainless steel wool inside, or the entire assembly of pipe 14, pipe section 30 and trap chamber 16 may be disposable. The outlet of pipe section 30 has a larger diameter than its inlet. The diameter of pipes 14 and 18 are equal to the outlet diameter of LPCVD reactor 12. In the present embodiment, pipes 14 and 18 are 1.5 inches in diameter. In another embodiment, pipes 14 and 18 may range from 1.0 to 3.0 inches in diameter, although many other sizes are within the scope of the present invention.

Pipe section 30 is gradually tapered from inlet to outlet such that the gas exiting pipe 14 undergo a gradual pressure gradient before passing into trap chamber 16. The inlet diameter of pipe section 30 is the same diameter as pipe 14, or about 1.5 inches. The outlet diameter of pipe section 30 at the inlet of trap chamber 16 ranges from 2.0 inches to 5.0 inches depending on the process. The outlet diameter of pipe section 30 is typically 33% or more larger than the diameter of its inlet. In the present embodiment, the outlet diameter of pipe section 30 of 2.0 inches for nitride and low temperature oxide processes. The outlet diameter of pipe section 30 for the polysilicon process is 3.0 inches. The gradual pressure gradient substantially reduces the particulates formed within pipe 14 and pipe section 30 thereby reducing particulate buildup within the pipes.

Note that the embodiment shown in FIG. 3 has more surface area of pipe section 30 exposed to ambient temperature than pipe section 28 in FIG. 2. Hence, pipe section 30 may experience a slightly greater heat dissipation at its surface and consequently a greater precipitation of particulate by-products within pipe 14 and pipe section 30. However, any increase in precipitation within pipe section 30 should not be significant.

In summary, the trap filter chamber in accordance with the present invention substantially reduces particulates from precipitating and accumulating in the inlet pipe by creating a gradual pressure gradient through it. The linear pressure gradient results from an outwardly expanding tapered diameter of the inlet pipe to the trap chamber. The gradual pressure gradient reduces particulate formation within the pipe connecting the LPCVD reactor to the trap filter chamber thereby substantially reducing particulate buildup within the inlet pipe.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A chemical vapor deposition trap, comprising:

a chamber for collecting chemical by-products, said chamber having an inlet coupled for receiving a vapor including said chemical by-products; and a first pipe having an inlet coupled for receiving said vapor at a first pressure, said first pipe having an outlet coupled to said inlet of said chamber where said outlet of said first pipe is tapered in a concave shape to reduce said first pressure of said vapor before entry into said chamber.

2. The chemical vapor deposition trap of claim 1 wherein said first pipe is linearly tapered.

3. The chemical vapor deposition trap of claim 2 wherein said inlet of said first pipe ranges from 1.0 inches to 3.0 inches.

4. The chemical vapor deposition trap of claim 3 wherein said outlet of said first pipe ranges from 2.0 inches to 5.0 inches.

5. The chemical vapor deposition trap of claim 4 further including:
- a second pipe having a first end coupled to an outlet of said chamber; and
- a vacuum pump coupled a second end of said second pipe.

6. The chemical vapor deposition trap of claim 5 further including:
- a third pipe having a first end coupled to an outlet of said vacuum pump; and
- a scrubber coupled a second end of said third pipe.

7. The chemical vapor deposition trap of claim 6 further including a reactor for generating said vapor and having an outlet coupled to said inlet of said first pipe.

8. A chemical vapor deposition trap, comprising:
- a chamber for collecting chemical by-products, said chamber having an inlet coupled for receiving a vapor including said chemical by-products; and
- a first pipe having an inlet coupled for receiving said vapor at a first pressure, said first pipe having a concave shaped tapered diameter from said inlet of said first pipe to an outlet of said first pipe that is coupled to said inlet of said chamber where said first pipe reduces said first pressure before entry into said chamber.

9. The chemical vapor deposition trap of claim 8 wherein said first pipe is linearly tapered.

10. The chemical vapor deposition trap of claim 9 wherein said inlet of said first pipe ranges from 1.0 inches to 3.0 inches.

11. The chemical vapor deposition trap of claim 10 wherein said outlet of said first pipe ranges from 2.0 inches to 5.0 inches.

12. The chemical vapor deposition trap of claim 11 further including:
- a second pipe having a first end coupled to an outlet of said chamber; and
- a vacuum pump coupled a second end of said second pipe.

13. The chemical vapor deposition trap of claim 12 further including:
- a third pipe having a first end coupled to an outlet of said vacuum pump; and
- a scrubber coupled a second end of said third pipe.

14. The chemical vapor deposition trap of claim 13 further including a reactor for generating said vapor and having an outlet coupled to said inlet of said first pipe.

\* \* \* \* \*